(12) United States Patent
Davis et al.

(10) Patent No.: US 6,579,430 B2
(45) Date of Patent: Jun. 17, 2003

(54) SEMICONDUCTOR WAFER PLATING CATHODE ASSEMBLY

(75) Inventors: Greg Davis, Oxnard, CA (US); Alex Moffatt, Thousand Oaks, CA (US); D. Morgan Tench, Camarillo, CA (US); John T. White, Lancaster, CA (US)

(73) Assignee: Innovative Technology Licensing, LLC, Thousand Oaks, CA (US)

( * ) Notice: Subject to any disclaimer, the term of this patent is extended or adjusted under 35 U.S.C. 154(b) by 78 days.

(21) Appl. No.: 10/012,081

(22) Filed: Nov. 2, 2001

(65) Prior Publication Data

US 2003/0085119 A1 May 8, 2003

(51) Int. Cl.[7] .................................................. C25B 9/00
(52) U.S. Cl. ........................... 204/297.01; 204/297.09; 204/297.1; 204/297.14
(58) Field of Search ......................... 204/297.01, 297.1, 204/297.14, 297.09

(56) References Cited

U.S. PATENT DOCUMENTS 6,156,167 A * 12/2000 Patton et al. .......... 204/297.01
6,248,222 B1 * 6/2001 Wang .................... 204/297.01
6,251,236 B1 * 6/2001 Stevens ................. 204/297.01

* cited by examiner

Primary Examiner—Bruce F. Bell

(57) ABSTRACT

A cathode assembly for semiconductor wafer plating employs a polymer coating on a metal structural ring to provide a low-profile seal to the perimeter of the wafer surface to be plated. The polymer coating also electrically insulates the metal so that it can be used in contact with the plating solution and still be part of the electrical contact system, eliminating the need for a protective plastic housing. This invention permits the dimensions of the cathode assembly to be minimized. A compact cathode assembly with minimum protrusion above the wafer plated surface enables modifications to the plating cell and agitation system providing more uniform copper deposits across the wafer surface and facilitating automation of the wafer plating process.

21 Claims, 3 Drawing Sheets

SEMICONDUCTOR WAFER PLATING CATHODE ASSEMBLY

CROSS-REFERENCE TO RELATED APPLICATIONS

This application is related to an application of D. Morgan Tench and John T. White entitled "Improved Semiconductor Wafer Plating Cell Assembly", which is being filed on the same date as this application.

BACKGROUND OF THE INVENTION

1. Field of the Invention

This invention is concerned with electroplating of semiconductor wafers, and in particular with the formation of copper integrated circuits (IC's) on semiconductor chips.

2. Related Prior Art

The electronics industry is in the process of transitioning from aluminum to copper as the basic metallization for semiconductor IC's. The higher electrical conductivity of copper reduces resistive losses and enables the faster switching needed for future generations of advanced devices. Copper also has a higher resistance to electromigration than aluminum.

The leading technology for fabricating copper circuitry on semiconductor chips is the "Damascene" process (see, e.g., P. C. Andricacos, Electrochem. Soc. Interface, Spring 1999, p. 32; U.S. Pat. No. 4,789,648 to Chow et al.; and U.S. Pat. No. 5,209,817 to Ahmad et al.). In this process, vias are etched through and trenches are etched in the chip's dielectric material, which is typically silicon dioxide, although materials with lower dielectric constants are desirable. A barrier layer, e.g., titanium nitride (TiN) or tantalum nitride (TaN), is first deposited into the trenches and vias by reactive sputtering to prevent Cu migration into the dielectric material and degradation of the device performance. Next, a thin copper seed layer is deposited by sputtering to provide the enhanced conductivity and good nucleation needed for copper electrodeposition. Copper is then electrodeposited into the trenches and vias. Excess copper deposited over the trenches and vias and in other areas is removed by chemical mechanical polishing (CMP). The "dual Damascene" process involves deposition in both trenches and vias at the same time. As used in this document, the general term "Damascene" also encompasses the dual Damascene process.

Damascene electroplating is generally performed on full silicon wafers, which are disks typically 8 inches (200 mm) in diameter and 0.03 inches (0.75 mm) thick. The industry trend is toward wafers of even larger diameters. Currently available wafer plating equipment employs a cathode assembly that includes a metallic backing plate, an insulating plastic housing, and a special metallic ring that makes electrical contact to the copper seed layer around the perimeter of the "plated" side of the wafer, i.e., the side of the wafer that is electroplated with copper. A concentric gasket (or o-ring) of smaller diameter is used to form a seal between the wafer plated-side surface and the plastic housing so as to prevent intrusion of the plating solution into the contact area and to the non-plated side of the wafer (opposite to the plated side). During plating, the electrolyte is pumped through at least one tubular nozzle directed at the wafer surface to provide bath agitation. The wafer is typically plated in the plated-side-down configuration and the cathode assembly is rotated to enhance the rate and uniformity of solution flow across the wafer surface.

A major problem with current wafer plating systems is that the gasket or o-ring used to form a seal to the wafer requires a reasonably thick mechanical support structure which protrudes past the wafer plated surface, impeding solution flow and causing nonuniform copper deposition. In addition, to accommodate the electrical contact assembly and protective plastic housing, the plating tank is made substantially larger in diameter than the wafer plated area so that the wafer perimeter of the plated area tends to be overplated because of the additional current paths through the additional plating solution. Note that the excess copper layer (above the trenches and vias) must be thin and uniform for practical CMP processing. Complicated baffles and shields are used in conjunction with cathode rotation to improve copper plating uniformity but these increase the complexity and expense of automation and do not provide optimum plating results. In addition, the requirement of cathode rotation is more easily fulfilled by exposing the wafer to the solution in the plated-side-down configuration for which trapping of bubbles within fine trenches and vias is a problem.

There is a critical need for a low-profile wafer plating assembly offering minimum impediment to solution flow across the wafer surface. Such an assembly would be valuable in providing more uniform Damascene copper plating and reducing costs for both the wafer plating and subsequent CMP processes. It would also facilitate plating in the plated-side-up configuration that would lead to further improvements in the uniformity of the copper deposit and enable plating of finer IC features.

A low-profile cathode assembly could also provide similar advantages for other wafer plating processes. For example, solder bumps for flip chip attachment are often fabricated by electroplating tin-lead solder on wafer pads exposed through a photoresist mask. The pads are electrically interconnected by a metallic seed layer (often gold but other metals are used), which is subsequently removed from non-pad areas of the wafer by wet chemical etching. Typically, the whole wafer is immersed in the plating tank and electrical contact to the seed layer on the plated side is established via spring-loaded, plastic-shielded wires at a few points (usually three). Overplating of pads near the wafer edge is suppressed by use of plastic shielding in the plating solution. It is important that approximately the same amount of solder be plated on all pads within a given IC chip so that the solder balls are sufficiently uniform in height to be coplanar with the flip chip attachment pads on the substrate. As the trend toward IC chip miniaturization continues and solder balls decrease in volume, the requirement for solder plating uniformity across the wafer is becoming more stringent. Even if the coplanarity requirement within individual chips is met, too much solder in the balls can cause bridging that shorts the device. On the other hand, too little solder can result in structurally unsound solder joints because of inadequate underfill in the narrow space available, diminished distance over which stresses caused by thermal expansion mismatches can be relieved, and/or solder joint embrittlement induced by excessive volume fraction of gold contamination from seed or barrier layers. Consequently, there is an increasing need for a cathode assembly enabling pads on wafers to be plated with equivalent amounts of solder.

SUMMARY OF THE INVENTION

Our invention is a cathode assembly for semiconductor wafer plating that employs an electrically insulating coating on a ring-shaped electrically-conductive structural support to provide an improved seal to the seed layer near the perimeter of the plated side of the wafer. The coating also electrically insulates the conductive support structure and prevents electroplating on areas exposed to the plating solution. Consequently, a protective plastic housing is not required and the conductive structure can be utilized in making electrical contact to the wafer. The conductive material is preferably metallic and the insulating coating is preferably comprised of a polymer material. By using a very thin polymer coating and a strong metal for the structural ring material, the height to which the cathode assembly extends above the wafer surface can be made very small compared to that required for conventional gasket or o-ring seals. The latter are themselves relatively thick and are typically supported by a thick plastic structure. It is also preferable that the insulating coating be sufficiently adherent to maintain its position on the support structure during wafer changes.

A low-profile cathode assembly constructed according to this invention and having a beveled or sloping inner edge offers minimal interference to electrolyte flow across the wafer surface. This eliminates the need for complicated baffling and permits the relatively uniform solution flow needed for uniform copper deposition, which can be provided by agitation systems based on cathode rotation and/or pumped solution flow. In addition, since a protective plastic housing is not needed, the overall diameter of the cathode assembly, and consequently the inner diameter of the plating tank, can be reduced to minimize overplating of the wafer perimeter. A relatively simple plastic shield, which need not be attached to the cathode assembly, can then be used to provide an even more uniform current distribution. This low-profile cathode assembly is also amenable to use in the plated-side-up configuration, which facilitates removal of air bubbles from fine trenches and vias in the wafer. The plated-side-up configuration also provides more flexibility in designing the plating tank so that its inner diameter matches the exposed wafer diameter to avoid the problem of overplating the wafer perimeter.

In a preferred embodiment, the seal to the wafer surface is provided by a polymer-coated metal ring having a sawtooth cross section so that force applied to compress the seal is concentrated along concentric circular ridges so as to provide maximum resistance to solution leakage past the seal. Use of multiple ridges provides redundancy, improving the seal effectiveness. For some applications, a single ridge or a flat seal may provide satisfactory results. Stainless steel is a preferred metal for fabricating the cathode assembly since it has the high strength needed for fabrication of stiff structures of minimum cross section. It also resists corrosion that could result from plating bath or rinse water contact, either directly or via pores in the polymer coating.

A preferred polymer coating material is polytetrafluoroethylene (PTFE), which is relatively soft and highly hydrophobic so that it tends to flatten in contact with the wafer surface and repel plating solution to form a very effective seal. It also provides outstanding protection and insulation to the metal since it is chemically inert and repels solution from pores in the coating due to its hydrophobicity. Very thin PTFE coatings applied by thermal spraying are highly adherent to stainless steel (and other metals). For improved seal performance and to suppress electroplating through pinholes, the PTFE coating can be thickened by multiple applications.

These figures are not to scale and some dimensions, particularly those of the polymer coating, have been greatly enlarged for better depiction.

DESCRIPTION OF THE INVENTION

This invention is a cathode assembly for semiconductor wafer plating that employs an electrically-insulating coating on a ring-shaped electrically-conductive support structure to provide an improved seal to the perimeter area of the plated side of the wafer. The insulating coating performs the dual function of forming the wafer seal and electrically insulating the conductive support structure so that it can be used in contact with the plating solution and still be part of the electrical contact system. Since the coating used to form the seal can be very thin and can be supported by a relatively strong metal structure, the extent of protrusion of the cathode assembly above the wafer plated-side surface can be minimized. Likewise, such a polymer coated metal structure replaces both the plastic support and protective housing used in the prior art so that the overall dimensions of the assembly can be significantly reduced. Such a compact cathode assembly with minimum protrusion above the wafer plated surface enables modifications to the plating cell and agitation system providing more uniform copper deposits across the wafer surface.

Figure 1:
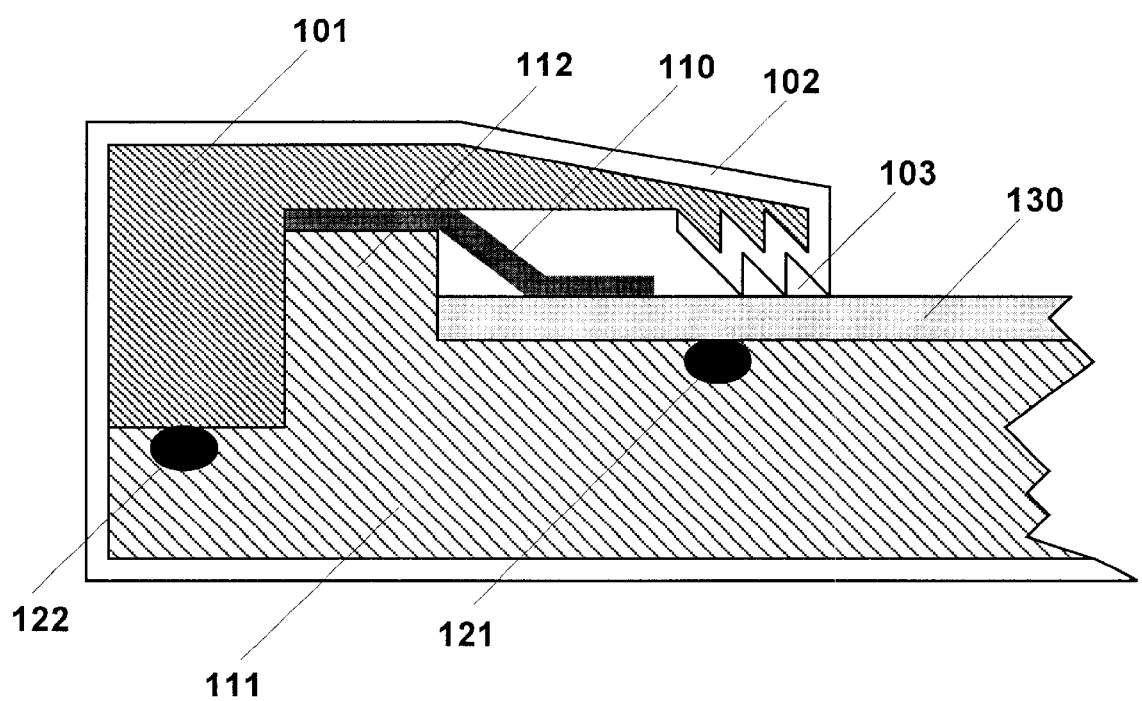
FIG. 1 is a cross-sectional view of one side of the seal-contact area of a representative low-profile wafer plating assembly according to the present invention.

FIG. 1 depicts one side of a low-profile cathode assembly for semiconductor wafer plating employing the polymer-coated metallic structure in a preferred embodiment of the present invention. The inner edge of concentric metal structural ring 101 overlaps the perimeter of the plated side of wafer 130 and has a polymer coating 102 disposed at least in the area of a seal 103 and preferably in other areas that contact the plating solution during operation. As depicted in FIG. 1, seal 103 preferably comprises concentric circular polymer-coated metal ridges that improve the effectiveness of the seal to the wafer by concentrating the applied force so as to increase the local seal pressure and by providing redundancy. Ridges of a variety of cross-sectional shapes may be used, including sawtooth, triangular, elliptical and hemispherical, as well as irregular geometric shapes. The apices of the ridges may need to be somewhat rounded in order to attain an adequate thickness of the polymer coating applied by some methods, and/or to avoid damaging the polymer coating. For some applications, especially those involving low hydrostatic pressure, such ridges may not be needed to provide an adequate seal between the polymer coating and the wafer. Note that a perfect seal is not required since the Damascene process in particular requires only a few minutes and a small amount of solution intrusion into the electrical contact area can be tolerated. The term "seal" is used here to denote sufficient impediment to solution flow to enable a given wafer plating process.

A means for establishing electrical contact to the seed layer on the wafer is required. Since the metallic seed layer is typically very thin so that its electrical resistance is appreciable, it is normally advantageous to have the electrical contact extend around the perimeter so as to equalize and minimize voltage losses that would otherwise cause nonuniform copper deposition. The wafer perimeter could be directly contacted by an uncoated portion of structural ring 101 but in this case it would be difficult to consistently establish both a good seal and a reliable contact, as well as to avoid breaking the typically brittle wafers during assembly. The contact surface of structural ring 101 could be softened by texturing but this is likely to be expensive and less effective than other alternatives.

A viable means of forming an electrical contact to the wafer perimeter (see FIG. 1) utilizes a separate metal contact ring 110 having inside fingers bent to form a series of spring contacts to the wafer surface. Metallic backing plate 111 has a raised portion 112 that presses against the continuous, radially outer portion of contact ring 110 to provide electrical contact to the wafer. Attachment of backing plate 111 to structural ring 101, for example via a series of machine screws (not shown), results in force being applied to both the seal 103 and the electrical contact ring 110. An o-ring or gasket 121 of elastic material, e.g., a rubber, may be included opposite the seal-contact area to help distribute the applied force between seal 103 and contact ring 110 to improve their performance and prevent breakage of the wafer. An o-ring or gasket 122 may be included between structural ring 101 and backing plate 111 to prevent intrusion of plating solution and rinse water into the assembly. A perpendicular metallic shaft (not shown) may be attached to the center of backing plate 111 for rotating the cathode assembly to provide more uniform bath agitation. Electrical contact to the rotating shaft can readily be provided by an electrical brush, of graphite, for example. If backing plate 111 contacts the plating solution during operation, polymer coating 102 can also be applied to the exposed surface areas (as shown in FIG. 1), or an auxiliary plastic backing plate (not shown) may be used.

Figure 2:
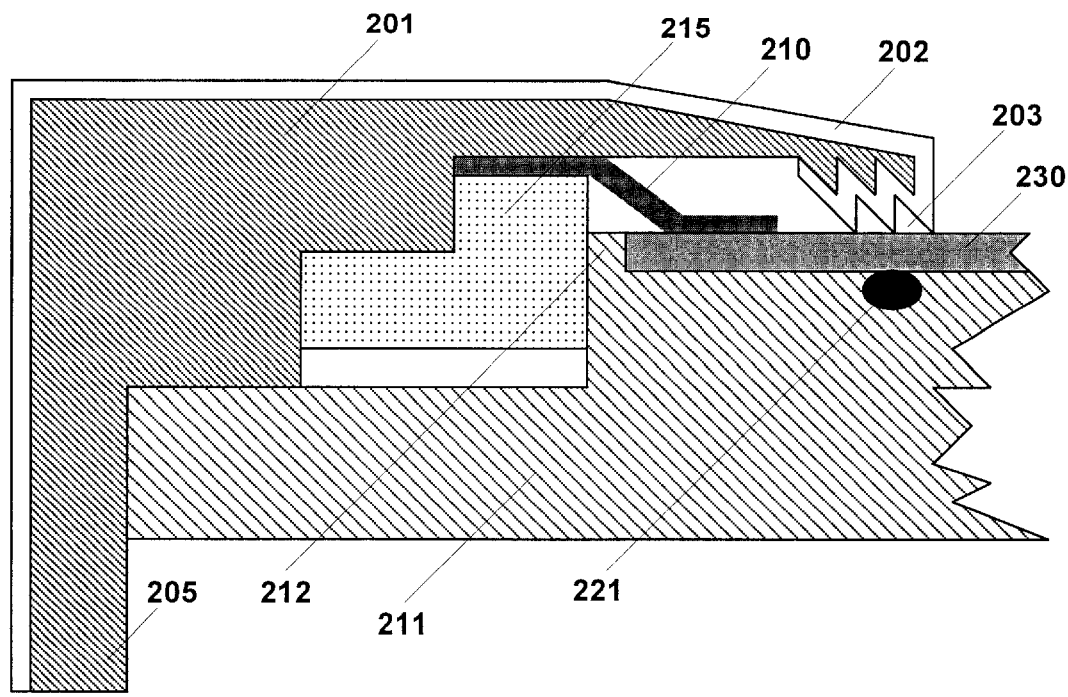
FIG. 2 is a cross-sectional view of one side of the seal-contact area of a representative low-profile wafer plating assembly having a secured electrical contact ring.

FIG. 2 depicts a preferred embodiment of the cathode assembly having a separate metallic contact pressure ring 215 and a separate backing plate 211 to provide independent control of the pressure on contact ring 210 and seal 203, respectively. Contact pressure ring 215 is attached to structural ring 201, for example by a series of machine screws (not shown), so as to apply pressure to the outer continuous portion of contact ring 210. Backing plate 211 preferably has a raised rim 212 for positioning the wafer and is attached to structural ring 201, for example by a series of machine screws (not shown). Alternatively, backing plate 211 can be attached directly to contact pressure ring 215, for example by a series of machine screws. The polymer coating is applied to the seal area 203 and all areas of structural ring 201 exposed to the plating solution during operation. The rim 205 of structural ring 201 can be extended in length to the extent needed to prevent plating solution and rinse water from contacting backing plate 211 during operation. In this case, polymer coating 202 would be applied over the seal area 203 and outer surface of structural ring 201 (as indicated in FIG. 2). If backing plate 211 is exposed to the plating solution, it may also be protected by the polymer coating or may be fabricated out of plastic or other insulating material. In this case, an appropriate o-ring or gasket (not shown) could be installed to provide a seal between backing plate 211 and structural ring 201. As appropriate, electrical contact can be established via structural ring 201, backing plate 211 or machine screws used for attachment.

The assembly depicted in FIG. 2 also provides facile wafer insertion and removal since the contact ring 210 is held in place by contact pressure ring 215. More rapid access to the wafer, if needed, e.g., for an automated system, can be provided by using a clamshell clamp or other rapid disconnect device instead of screws for attaching backing plate 211 to structural ring 201. Automation using the assembly in FIG. 2 is even simpler for plating in the plated-side-up configuration without cathode rotation. In this case, backing plate 211 would be replaced by a wafer carrier that would robotically press the wafer against seal 203 and hold it in place during plating. Rotation of the wafer carrier after retraction from the cathode assembly could be used to remove the plating solution and rinse water. A clamping device or vacuum system could be used to hold wafer 230 in place during wafer carrier rotation.

The present invention encompasses wafer plating cathode assemblies having a wide variety of specific structural ring cross-sections and shapes, electrical contact arrangements, and backing plate designs. For example, low-profile assemblies are enabled by the invention but the contour of the portion of the assembly protruding above the wafer surface may, in some cases, be more important to uniform solution flow than the maximum protrusion. Contact rings of a wide variety of cross-sections and shapes can be employed, or electrical contact can be provided by other means, e.g., fine wires or metallic wool. The structural ring, electrical contact ring, contact pressure ring and seal are preferably circular and concentric for circular wafers but other shapes, e.g., elliptical, could be used for plating either circular wafers or wafers of other shapes.

The wafer plating assembly of the present invention can be fabricated using a wide variety of electrically conducting materials. Metals tend to have relatively high conductivity and are preferred but other conductors, e.g., carbon or metallized plastics, could also be used. Practically any structural metal (including alloys) providing adequate adhesion for the insulating coating can be used for the structural ring (and the backing plate). Metals having high strength permit use of thinner structures to provide lower profiles or better contours, and those with good corrosion resistance may permit use of thinner insulating coatings and provide a more robust electrical contact. The metal used for the electrical contact ring is not critical but preferably has good elasticity to provide spring-loading of the contact, and good resistance to oxidation and corrosion caused by plating bath constituents. Most metals have adequate conductivity. Preferred contact metals are stainless steel and beryllium copper but many others would be acceptable. A variety of acceptable plastic and o-ring/gasket materials are readily available for use as backing plates and seals.

The wafer plating assembly of the present invention can be fabricated using a wide variety of insulating materials, including organic polymers, ceramics, and composites. Insulating ceramic materials with good chemical resistance include metallic oxides, such as alumina. Polymer coatings have the advantages of pliability and ease of application. The coating should be compatible with the plating bath used. Good adhesion to the structural ring material is also desirable but may not be required for some cathode assembly configurations. In addition, the coating should be sufficiently thin and conformal that ridges provided in the structural ring (to improve the effectiveness of the seal to the wafer) remain distinct and sufficiently sharp to be effective. It is also preferable that the coating material be relatively soft so as to form a better seal by tending to conform to the substrate, and be hydrophobic so that plating solution is repelled from the seal and from pores in the coating. The thickness of the coating need not be the same for all areas of the cathode assembly. For example, a thicker or thinner coating might be advantageous for forming a seal compared to protecting other areas of the assembly from corrosion or extraneous electroplating through coating pores.

Although a wide variety of polymer materials can be used to provide the adherent coating required for the present invention, halocarbon polymers are particularly well suited for this application since they are chemically inert and very hydrophobic, and tend to be relatively soft and compliant. Polytetrafluoroethylene (trade name Teflon®) is a preferred coating material but other halocarbon polymers, e.g., polytrifluorochloroethylene (Kel-F®), have similar properties. Various halocarbons may be mixed or combined with other polymers for ease of application or to attain a desired property, e.g., low porosity. Since most organic polymers tend to be hydrophobic and reasonably soft, any polymer material that is stable in the electroplating bath and can be applied as an adherent, conformal coating could provide acceptable results.

Conformal polymer coatings can be applied by various methods, including liquid spraying and powder coating, and many such coatings are applied as commercial processes. Liquid spraying typically involves a liquid carrier/solvent and subsequent fusion by thermal treatment, and is preferred since it tends to provide coatings with low porosity. Powder coatings are applied by electrostatic spraying to a heated substrate (e.g., 200° C.) followed by thermal fusion at a higher temperature (e.g., 350° C.), which avoids use of liquid carriers or solvents but produces more porous coatings. Polymer coatings may also be applied as mixtures that are polymerized in place on the part.

The cathode assembly of the present invention can be applied to practically any wafer electroplating process, including those used for Damascene copper IC fabrication and solder bumping. Any wafer material, including silicon, germanium, silicon-germanium and gallium arsenide, can be plated using the assembly.

PREFERRED EMBODIMENT

The preferred configuration for the wafer plating cathode assembly of this invention is depicted in FIG. 2. Structural ring 201 has a sawtooth cross section in seal area 203 and a sloping inside rim on the opposite side that protrudes minimally above the surface of wafer 230. Electrical contact is made via a contact ring 210 having fingers that press against the plated-side perimeter of wafer 230. Contact ring 210 is held in place by contact pressure ring 215, independent of any backing plate used.

Figure 3:
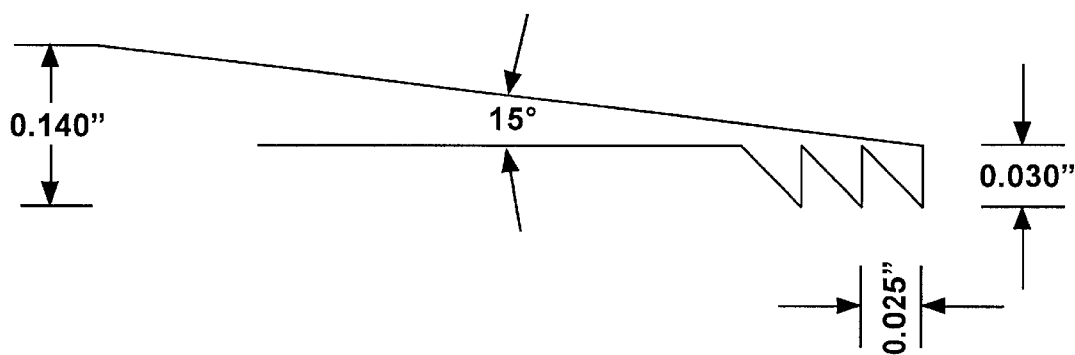
FIG. 3 is a cross-sectional view illustrating the profile and dimensions of the portion of the wafer plating assembly protruding above the wafer plated-side surface for a preferred embodiment of the present invention.

FIG. 3 shows the detailed structure and dimensions for the seal-contact area of a preferred structural ring before the polymer coating is applied. The seal area has three concentric circular sawtooth ridges 0.030 inch (0.75 mm) high and 0.025 inch (0.63 mm) apart. The ridges are slightly rounded, having a radius of curvature of about 0.003 inch (0.08 mm). The protrusion above the wafer surface increases from 0.030 inch (0.75 mm) at the inside perimeter to 0.14 inch (3.5 mm) with a constant slope of 15° relative to the wafer surface. The preferred polymer coating is about 0.003 to 0.005 inch (0.1 mm) thick so that its effect on the dimensions, especially those of the seal ridges, is not large.

The preferred polymer coating is uniform in thickness and comprised of at least one halocarbon polymer, and is applied by liquid spraying at room temperature and baking at elevated temperature (typically above 300° C.). Multiple coating layers are preferred to avoid pinholes. A primer layer of different composition may be useful for improving coating adhesion. A specific preferred polymer coating comprises a primer layer of PTFE and subsequent layers of (poly)-fluorinated-ethylene-propylene (PFEP) applied by liquid spraying at room temperature, and baked at about 350° C.

EXAMPLES

Wafer Plating Assembly Fabrication

Cathode assemblies of the types depicted in FIGS. 1 and 2 and having the seal dimensions depicted in FIG. 3 were fabricated for use with eight-inch wafers. Fabrication materials were 304 stainless steel for structural rings, contact pressure rings and backing plates, rubber for o-rings, and beryllium-copper alloy for contact rings. When flat, the latter were 0.005 inch (0.13 mm) thick, 8.15 inches (20.7 cm) o.d. and 0.766 inches (19.4 cm) i.d. overall. Fingers approximately 0.13-inch (3.2 mm) square and 0.13-inch (3.2 mm) apart were machined on the inside of the contact rings and were bent (in a custom fixture) so as to contact the wafer perimeter when installed in the cathode assembly. A commercial polymer coating comprised of one layer of Dupont® PTFE primer (baked at 370° C.) and three layers of Dupont® PFEP (baked at 340° C.) was applied (by Stamar Engineering Co., South Gate, Calif.) to the seal and all other areas exposed to the plating bath during operation. The total thickness of the coating was 0.003 inch (0.08 mm) to 0.004 (0.1 mm) thick.

EXAMPLES

Wafer Plating

In the cathode assemblies fabricated, both eight-inch wafers and 304 stainless steel disks of the same dimensions were electroplated from a copper pyrophosphate plating bath (operated at 55° C. and pH 8.3). The bath contained 22.5 g/L copper ions ($Cu^{2}+$), 173 g/L pyrophosphate ions [$(P_2O_7)^{4-}$], 2.25 g/L ammonia ($NH_3$), and 2.0 ppm 2,5-dimercapto-1,3,4-thiadiazole as an organic additive. Plating was performed in the plated-side-down configuration with rotation of the cathode assembly at 100 rpm, and in the plated-side-up configuration with solution agitation provided by pumped recirculation. Uniform plating was indicated by a uniform color change for very thin copper layers plated over the surface of stainless steel cathodes, and by successful CMP processing of wafers.

The preferred embodiments of this invention have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

What is claimed is:

1. A cathode assembly for electroplating a semiconductor wafer, comprising:
    an electrically conducting structural ring;
    an insulating coating over a portion of said structural ring; and
    an electrical contact to the wafer surface to be plated,
    wherein physical contact between said coating and the wafer surface forms a seal that substantially impedes flow of liquid to said electrical contact.

2. The cathode assembly of claim 1, wherein said structural ring is circular in shape and has an inside diameter smaller than the outside diameter of the wafer such that a ring-shaped overlapping area exists when said structural ring is placed concentrically in contact with the wafer.

3. The cathode assembly of claim 1, wherein said structural ring is thinner on the inside to reduce resistance to solution flow across the wafer surface.

4. The cathode assembly of claim 1, wherein said structural ring includes a ridge to improve the seal effectiveness.

5. The cathode assembly of claim 4, wherein said ridge has a sawtooth, triangular, hemispherical or elliptical cross-sectional shape.

6. The cathode assembly of claim 1, wherein said insulating coating is present on areas of said structural ring not in contact with the wafer so as to suppress metal electrodeposition on said structural ring.

7. The cathode assembly of claim 1, wherein said insulating coating comprises a ceramic material.

8. The cathode assembly of claim 1, wherein said insulating coating comprises a polymer material.

9. The cathode assembly of claim 1, wherein said polymer coating includes polymerized halocarbon compounds.

10. The cathode assembly of claim 1, wherein said electrical contact comprises a thin metallic electrical contact ring.

11. The cathode assembly of claim 10, wherein said electrical contact ring has fingers that press against the plated side of the wafer.

12. The cathode assembly of claim 10, wherein said electrical contact ring comprises beryllium copper alloy or stainless steel.

13. The cathode assembly of claim 10, wherein said electrical contact ring is less than 0.25 mm thick.

14. The cathode assembly of claim 10, further comprising a metallic contact pressure ring that is attached to said structural ring and presses against said electrical contact ring so as to establish electrical contact to the wafer surface.

15. The cathode assembly of claim 14, further comprising a backing plate attached either to said structural ring or to said contact pressure ring so as to press the wafer plated-side surface against the seal area.

16. The cathode assembly of claim 15, wherein said backing plate is comprised of materials selected from the groups consisting of metals, alloys and plastics.

17. The cathode assembly of claim 15, further comprising an o-ring or gasket seal between said backing plate and said structural ring to prevent liquid from entering the cathode assembly.

18. The cathode assembly of claim 15, further comprising an o-ring or gasket between said backing plate and the wafer to redistribute forces generated during assembly so as to prevent breakage of the wafer.

19. The cathode assembly of claim 10, further comprising a metallic backing plate attached to said structural ring and having a circular rim that presses against said electrical contact ring so as to establish electrical contact to the wafer plated-side surface.

20. A cathode assembly for electroplating a semiconductor wafer, comprising:

a metallic structural ring having an inside diameter that is smaller than the outside diameter of the wafer to be electroplated, such that a ring-shaped overlapping area exists when said structural ring is placed concentrically in contact with the wafer;

a polymer coating over a portion of said structural ring; and an electrical contact to the wafer surface to be plated, wherein physical contact between said coating and the wafer surface forms a seal that substantially impedes flow of liquid to said electrical contact.

21. The cathode assembly of claim 20, wherein said structural ring includes a ridge to improve the seal effectiveness.

* * * * *